United States Patent
Usami et al.

(10) Patent No.: US 6,813,750 B2
(45) Date of Patent: Nov. 2, 2004

(54) LOGIC CIRCUIT DESIGN EQUIPMENT AND METHOD FOR DESIGNING LOGIC CIRCUIT FOR REDUCING LEAKAGE CURRENT

(75) Inventors: Kimiyoshi Usami, Kanagawa-ken (JP); Naoyuki Kawabe, Kanagawa-ken (JP); Takeshi Kitahara, Kanagawa-ken (JP); Masahiro Kanazawa, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 133 days.

(21) Appl. No.: 10/114,159

(22) Filed: Apr. 1, 2002

(65) Prior Publication Data

US 2002/0144223 A1 Oct. 3, 2002

(30) Foreign Application Priority Data

Apr. 2, 2001 (JP) .................................. P2001-103695

(51) Int. Cl.[7] .............................................. G06F 17/50
(52) U.S. Cl. ................................................. 716/4; 716/2
(58) Field of Search .................... 716/4, 2, 10; 714/724

(56) References Cited

U.S. PATENT DOCUMENTS

| | | | |
|---|---|---|---|
| 5,426,591 A | | 6/1995 | Ginetti et al. |
| 5,774,367 A | | 6/1998 | Reyes et al. |
| 6,493,856 B2 | * | 12/2002 | Usami et al. ............... 716/10 |
| 2002/0099989 A1 | * | 7/2002 | Kawabe et al. ............. 714/724 |

FOREIGN PATENT DOCUMENTS

| | | |
|---|---|---|
| EP | 1 058 386 A1 | 12/2000 |
| EP | 1 168 205 A2 | 1/2002 |

OTHER PUBLICATIONS

Usami et al., Automated Selective Multi–Threshold Design For Ultra–Low Standby Applications, Proceedings of the 2002 International Symposium on Low Power Electronics and Design, pp. 202–206, Aug. 2002.*

K. Usami et al., Low–Power Design Methodology and Applications Utilizing Dual Supply Voltages, Proceedings of the 2000 Conference on Asia and South Pacific Design Automation, pp. 123–128, Jan. 2000.*

European Search Report dated Aug. 7, 2002 corresponding to European Patent Application No. 02 00 7284.9–2215.

Proceedings of ACM Design Automation Conference (DAC98), pp. 489–494, "Design and Optimization of Low Voltage High Performance Dual Threshold CMOS Circuits"; L. Wei et al.; Jun. 15–19, 1998.

* cited by examiner

Primary Examiner—A. M. Thompson
(74) Attorney, Agent, or Firm—Gray Cary Ware & Freidenrich LLP

(57) ABSTRACT

A logic circuit design equipment and a logic circuit design method include analyzing input states of all of first cells, respectively, analyzing leakage currents of all of first cells in a case where each first cell is high Vth cell showing a small leakage current at a low speed operation and low Vth cell showing a large leakage current at a high speed operation, respectively, and substituting the first cells for second cells within a range satisfying a timing restriction. Herein, a threshold of the second cell is different from a threshold of the first cell.

20 Claims, 14 Drawing Sheets

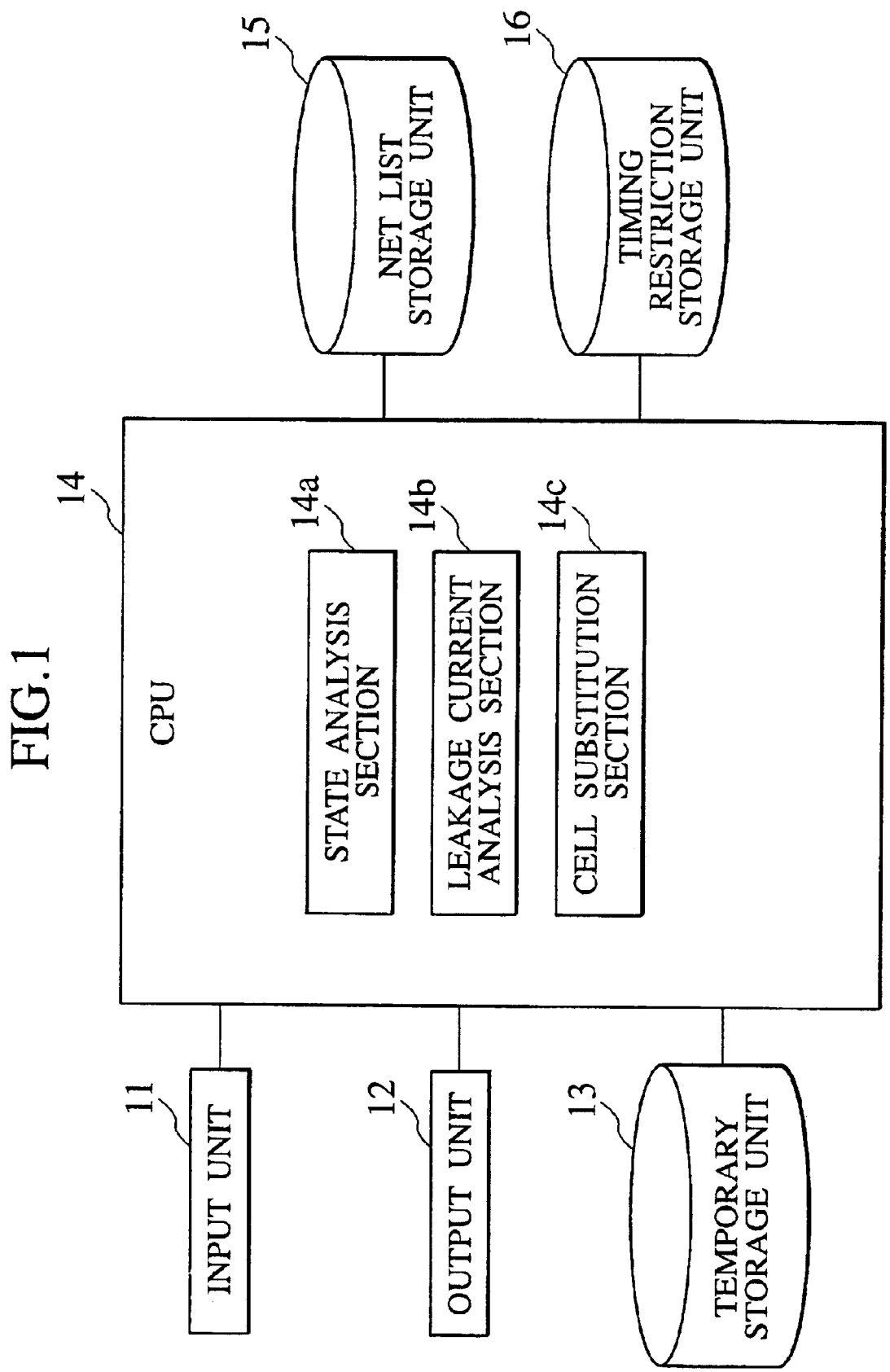

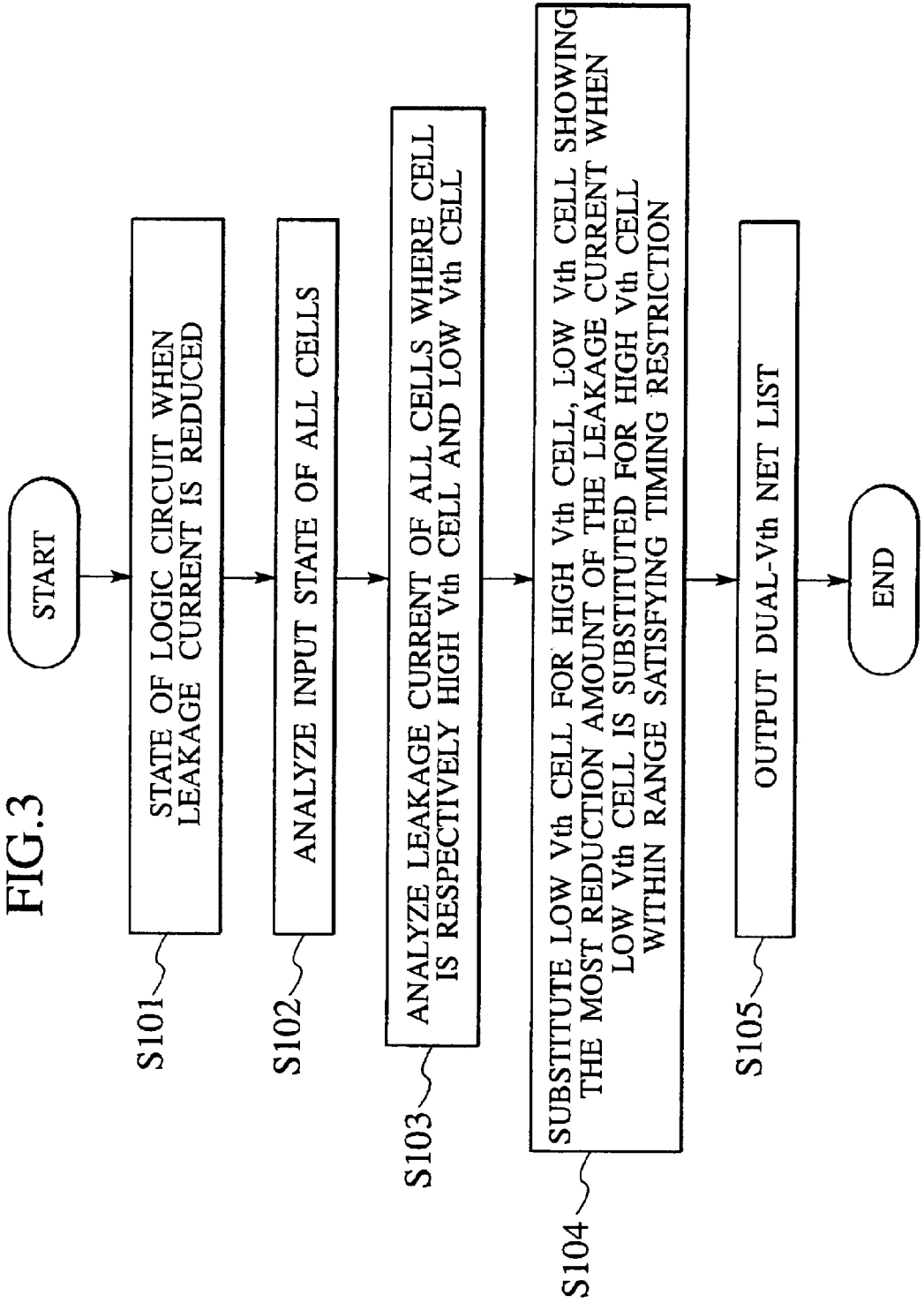

FIG.4

| INPUT STATE | LEAKAGE CURRENT | |
| --- | --- | --- |
| | LOW Vth | HIGH Vth |
| "0 , 0" | 1 | 0.1 |
| "1 , 1" | 10 | 1 |

FIG.9

| INPUT STATE | | | LEAKAGE CURRENT [pA] | | | | |
|---|---|---|---|---|---|---|---|
| a | b | c | INV | NAND 2 | NOR 2 | AND 3 | OR 3 |
| 0 | 0 | 0 | 46 | 10 | 94 | 148 | 266 |
| 0 | 0 | 1 | — | — | — | 152 | 183 |
| 0 | 1 | 0 | — | 41 | 129 | 152 | 170 |
| 0 | 1 | 1 | — | — | — | 183 | 87 |
| 1 | 0 | 0 | 153 | 40 | 142 | 155 | 171 |
| 1 | 0 | 1 | — | — | — | 182 | 87 |
| 1 | 1 | 0 | — | 315 | 46 | 184 | 88 |
| 1 | 1 | 1 | — | — | — | 467 | 69 |

FIG.10A

| GATE/TOTAL | NOR2 45 | INV 46 | NAND2 47 | INV 48 | NOR2 49 | TOTAL |
|---|---|---|---|---|---|---|
| LEAKAGE CURRENT [pA] | 142 | 46 | 41 | 46 | 46 | 321 |

FIG.10B

| GATE/TOTAL | OR3 42 | INV 48 | NOR2 49 | TOTAL |
|---|---|---|---|---|
| LEAKAGE CURRENT [pA] | 171 | 46 | 46 | 263 |

FIG.10C

| GATE/TOTAL | NOR2 45 | INV 46 | AND3 44 | TOTAL |
|---|---|---|---|---|
| LEAKAGE CURRENT [pA] | 142 | 46 | 152 | 340 |

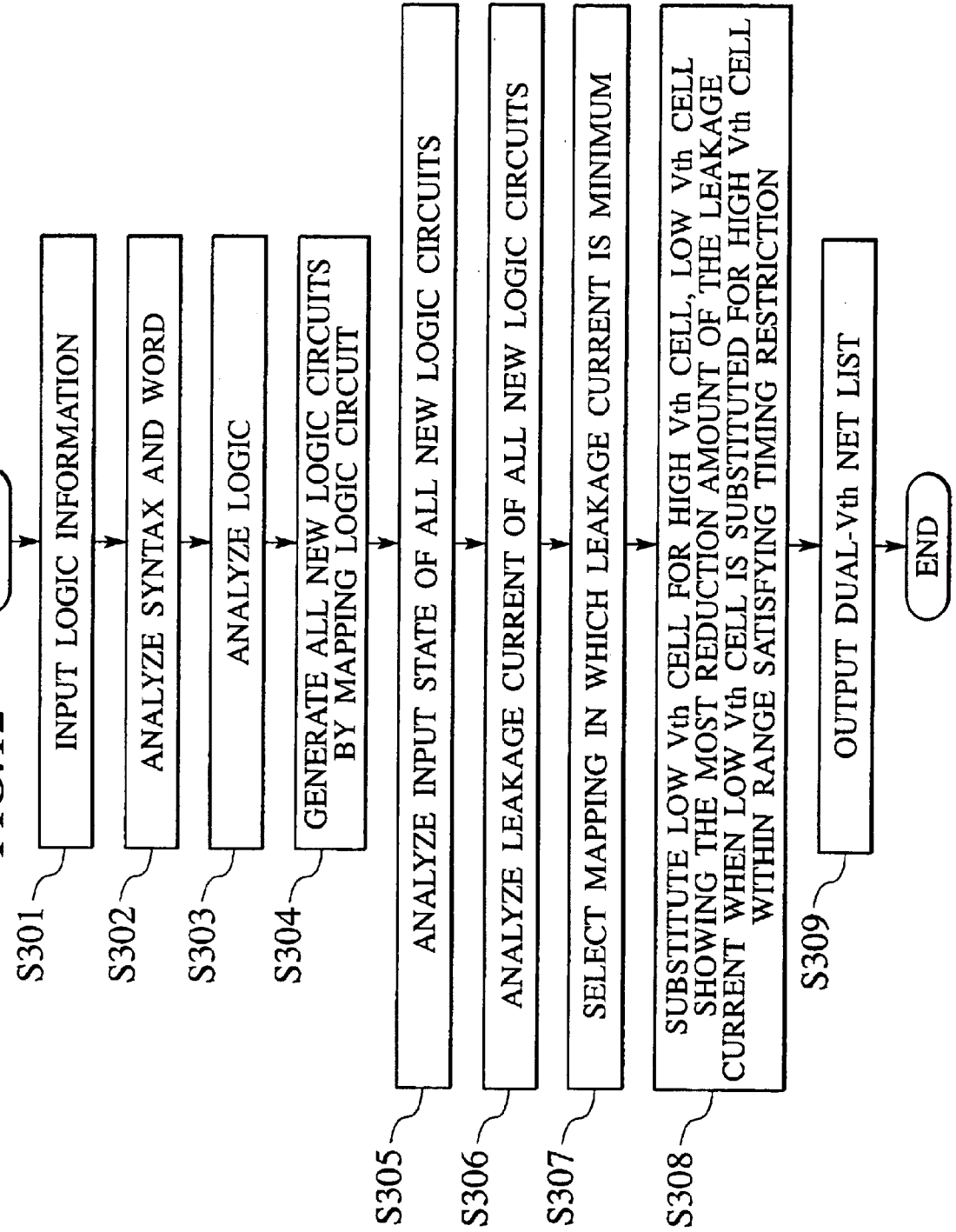

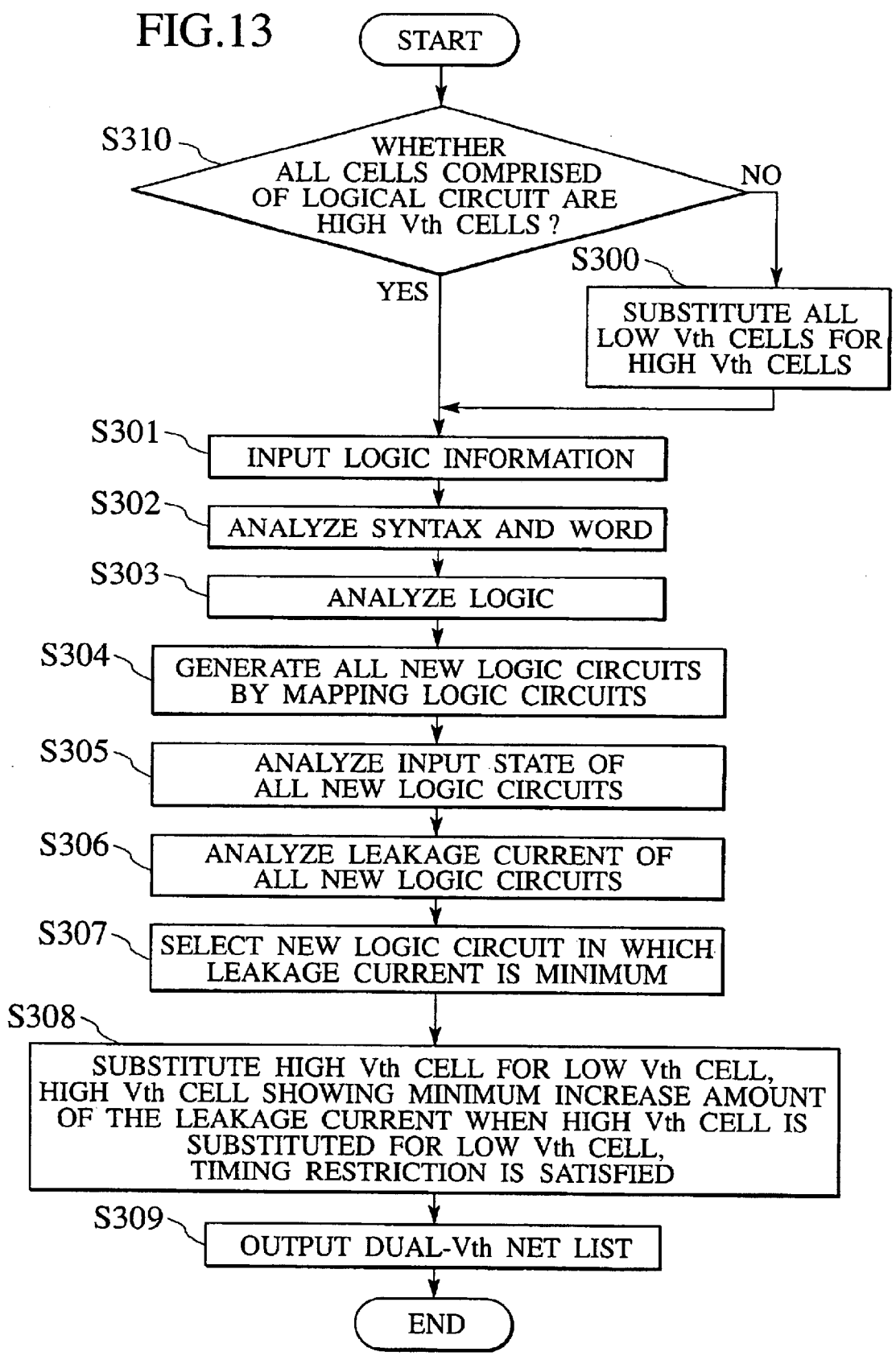

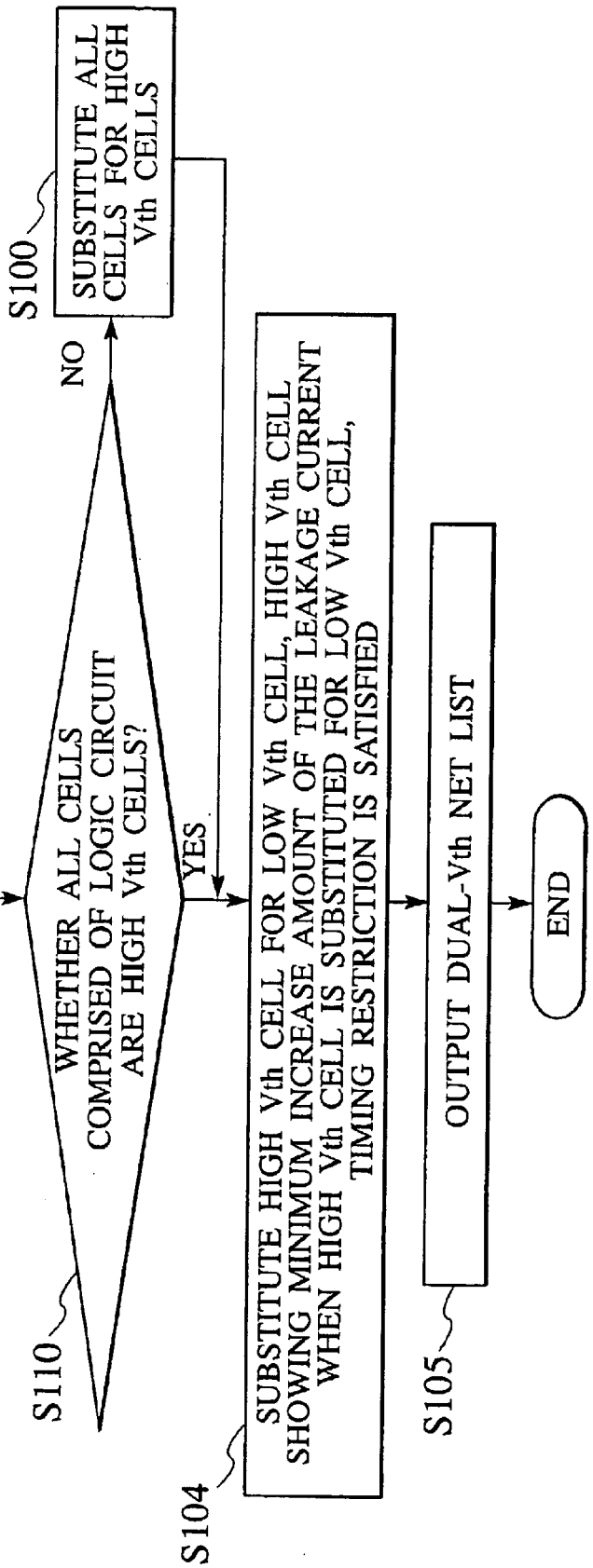

LOGIC CIRCUIT DESIGN EQUIPMENT AND METHOD FOR DESIGNING LOGIC CIRCUIT FOR REDUCING LEAKAGE CURRENT

CROSS REFERENCE TO RELATED APPLICATIONS

The applicant is based upon and claims the benefit of priority from prior Japanese Patent Application P2001-103695, filed Apr. 2, 2001; the entire contents of which are incorporated by reference therein.

BACKGROUND OF THE INVENTION

1. Field of the Invention

The present invention relates to a logic circuit design equipment and a method for designing a logic circuit. The present invention relates more particularly to a technology for reducing leakage current.

2. Description of the Related Art

As the voltage used for driving large scale integrated circuits has reduced in recent years, the threshold values (Vth) of transistors have increasingly been lowered. The lowering of the threshold values increases sub-threshold leakage current (hereinafter referred to as a leakage current). This leakage current flows during an active periods when the circuit is in operation, as well as during standby periods when circuit operation has been stopped.

As a technique to reduce such leakage current, Dual-Vth technology has been known. Dual-Vth technology is one in which both low Vth cells formed by low Vth transistors and high Vth cells formed by high Vth transistors are used in the same logic circuit. According to this technology, leakage current is reduced by use of high Vth cells with low speed operation on a path having some latitude with respect to timing. On the other hand, by the use of a low Vth cell with high speed operation, timing restriction of a path with tight timing can be fully and easily achieved, although this causes leakage current to increase.

In the logic circuit using Dual-Vth technology, the whole of an original logic circuit is constituted by, for example, low Vth cells first. Then, the logic circuit is constituted so as to reduce leakage current by substituting high Vth cells for low Vth cells on a path having latitude with respect to timing, as long as the timing allows. Here, there is a great difference between leakage currents even with in the same cell dependent on the state in which input to the cell. In spite of the difference between leakage currents, in the conventional method for designing the logic circuit, cell substitution has been performed irrespective of the state in which input to the cell. Accordingly, it is not always possible to produce a logic circuit displaying minimal leakage current.

The increase in leakage current that has accompanied microfabrication processing has been a problem in recent years. In such a logic circuit, mapping to integrate a plurality of logic gates into one logic gate has been performed in order to minimize the area and delay time, or in order to reduce leakage current itself. However, in such a case, the possibility that the difference in the leak currents in cells constituting the logic circuit may depend on the state in which input has not been considered. Accordingly, there is a problem that mapping to constitute a logic circuit showing minimum leakage current is not always performed.

Furthermore, in the recent appliances such as portable telephones and portable terminals, if leakage current during standby time were reduced it would be possible to greatly lengthen the life of a battery. Consequently, the development of a logic circuit showing a minimum possible leakage current during standby time is in demand.

SUMMARY OF THE INVENTION

According to a first aspect of the present invention, a logic circuit design equipment has a state analysis section, a leakage current analysis section, and a cell substitution section. The state analysis section has a function of analyzing the input states of all of first cells, respectively. The leakage current analysis section has a function of analyzing the leakage currents of each of the first cells where each first cell is a high Vth cell showing a small leakage current at a low speed operation or a low Vth cell showing a large leakage current at a high speed operation, respectively. The cell substitution section has a function of substituting first cells for second cells within a range satisfying a timing restriction. Here, the threshold of second cells is different from the threshold of first cells.

According to a second aspect of the present invention, a logic circuit design equipment has a technology mapping section, a state analysis section, a leakage current analysis section, and a mapping selection section. The technology mapping section has a function of generating new logic circuits formed by mapping a plurality of logic gates constituting a logic circuit to one equivalent logic gate within a range satisfying a timing restriction. The state analysis section has a function of analyzing the input states of each of the new logic circuits, respectively. The leakage current analysis section has a function of calculating the leakage currents of each of the new logic circuits, respectively. The mapping selection section has a function of comparing the leakage currents of each of the new logic circuits with the others so as to select the new logic circuit in which leakage current is minimized.

According to a third aspect of the present invention, a method for designing a logic circuit includes analyzing the input states of all first cells respectively, analyzing the leakage currents of each first cells when each first cell is a high Vth cell showing a leakage current at a low speed operation or when each first cell is a low Vth cell showing a large leakage current at a high speed operation respectively, and substituting second cells for first cells within a range satisfying a timing restriction. Here, the threshold of second cells is different from the threshold of first cells.

According to a fourth aspect of the present invention, a method for mapping a logic circuit includes generating all new logic circuits constituted by mapping a plurality of logic gates which constitute a logic circuit to one equivalent logic gate within a range satisfying a timing restriction, analyzing the input states of each of the new logic circuits respectively, calculating the leakage currents of each of the new logic circuits respectively, comparing the leakage currents of each of the new logic circuits with the others, and selecting the new logic circuit in which leakage current is minimized.

BRIEF DESCRIPTION OF THE DRAWINGS

FIG. 1 is a block diagram showing a constitution of a logic circuit design equipment according to a first embodiment of the present invention.

FIG. 3 is a flowchart showing an operation of the logic circuit design equipment according to the first embodiment of the present invention (1).

FIG. 4 is a table illustrating a magnitude of a leakage current in accordance with an input state of a cell of the logic circuit design equipment according to the first embodiment of the present invention.

FIG. 9 is a table illustrating an example of leakage current data obtained by listing leakage currents depending on the input states of cells according to the second embodiment of the present invention.

FIG. 10A is a table illustrating leakage current data of the logic circuit shown in FIG. 8A.

FIG. 10B is a table illustrating leakage current data of the logic circuit shown in FIG. 8B.

FIG. 10C is a table illustrating leakage current data of the logic circuit shown in FIG. 8C.

FIG. 12 is a flowchart showing an operation of the logic circuit design equipment according to the third embodiment of the present invention (1).

FIG. 13 is a flowchart showing an operation of the logic circuit design equipment according to the first embodiment of the present invention (2).

FIG. 14 is a flowchart showing a method of the logic circuit design according to other embodiment of the present invention.

DETAILED DESCRIPTION OF THE INVENTION

Figure 2A:
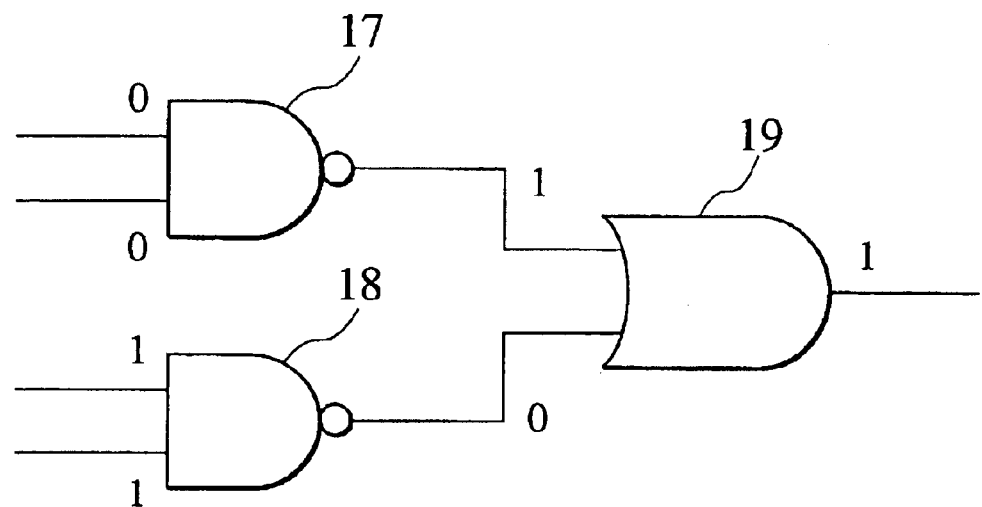
FIG. 2A is a circuit diagram showing part of a logic circuit.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, as is conventional in the representation of semiconductor devices, it will be appreciated that the various drawings are not drawn to scale from one figure to another nor inside a given figure, and in particular that the layer thicknesses are arbitrarily drawn to facilitate the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention with unnecessary detail.

FIRST EMBODIMENT (Constitution of Logic Circuit Design Equipment)

As shown in FIG. 1, a logic circuit design equipment according to a first embodiment of the present invention has a processing control unit (CPU) 14, a temporary storage unit (main storage unit) 13, an input unit 11, an output unit 12, a net list storage unit 15 and a timing restriction storage unit 16.

Figure 2B:
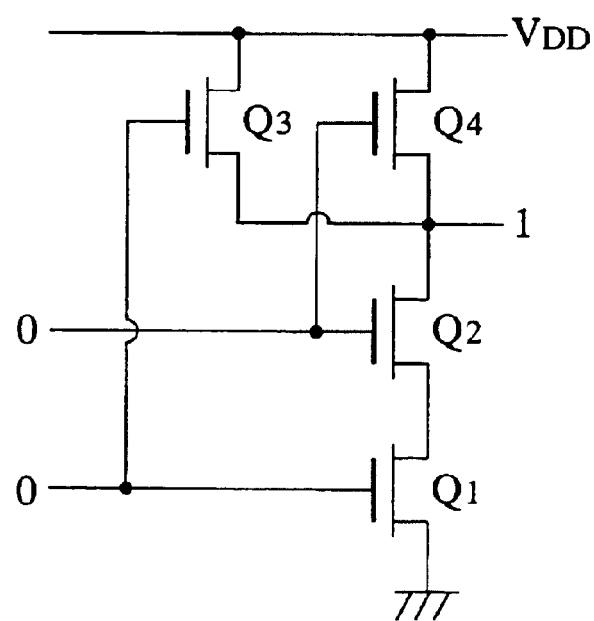
FIG. 2B is a circuit diagram showing the constitution of the two-input NAND gate 17, 18.

The CPU 14 controls the whole of the logic circuit design equipment according to the first embodiment of the present invention. The CPU 14 is constituted by a state analysis section 14a, a leakage current analysis section 14b and a cell substitution section 14c. In the embodiments of the present invention, a "cell" refers to a base unit constituting a logic circuit such as a logic gate, a flip-flop, and the like, which is called an "instance". For example, a two-input NAND gate 17 and 18, and a two-input OR gate 19 which are logic gates, as shown in FIG. 2, are cells. The two-input NAND gate 17 and 18 are included in CMOS transistors Q1 to Q4 as shown in FIG. 2B, respectively. In the cell, in terms of a threshold, there are high Vth cells constituted by high Vth transistors with low speed operation showing a small leakage current and low Vth cells constituted by low Vth transistors with high speed operation showing a larger leakage current than that of the high Vth cell. For example, each of the CMOS transistors Q1 to Q4 of the two-input NAND gate 17 as shown in FIG. 2B are high Vth cells respectively when the two-input NAND gate 17 is shown in FIG. 2A.

The state analysis section 14a shown in FIG. 1 has a function of analyzing the input states of all of first cells, respectively. In this embodiment of the present invention, one of either the first or second cells is "a low Vth cell" which operates at a relatively high speed and shows a large leakage current, and the other is "a high Vth cell" which operates at a relatively low speed and shows a small leakage current. Specifically, if the first cell is a low Vth cell, the second cell is a high Vth cell. Alternatively, if the first cell is a high Vth cell, the second cell is a low Vth cell.

The leakage current analysis section 14b has a function of analyzing the leakage current of each of the first cells respectively when each of the first cells are high Vth cells or when each of the first cells are the low Vth cells. The cell substitution section 14c has a function of substituting second cells for first cells.

In a case where the first cells are low Vth cells, the cell substitution section 14C preferentially substitutes the second cells (the high Vth cells) for cells which show greater leakage current reduction by this substitution from among the low Vth cells within a range satisfying a timing restriction. And, in a case where the first cells are high Vth cells, the cell substitution section 14c preferentially substitutes the second cells (the low Vth cells) for cells which show less leakage current increase by this substitution from among the high Vth cells on a path that has violated the timing restriction in order to satisfy the timing restriction.

A ROM, a RAM and the like are incorporated in the temporary storage unit 13. The ROM functions as a program memory for storing a program executed in the CPU 14. The RAM functions as a data memory which stores data used during the execution of the program in the CPU 14 and is used as a work area. The input unit 11 is constituted by a keyboard, a mouse and the like. The user specifies information about a state of the logic circuit whose leakage current he seeks to reduced to the CPU 14 via the input unit 11. Specifically, the state analysis section 14a analyzes the input state of each cell under a state of the specified logic circuit. The output unit 12 is constituted by a liquid crystal display (LCD), a CRT display, a printer and the like. A net list unit 15 stores a net list having connection description information of logics such as logic simulation results. The timing restriction storage section 16 stores timing restrictions such as the maximum delay restriction of the path in the logic circuit.

According to the logic circuit design equipment of the first embodiment of the present invention, the first cells are substituted by the second cells in consideration of the input states of the cells, whereby the leakage currents of the logic circuit including both high Vth cell and low Vth cell (hereinafter referred to as a Dual-Vth logic circuit) can be minimized.

(Operation (1) of Logic Circuit Design Equipment)

Referring to FIG. 3, in a case where the first cells are low Vth cells and the second cells are high Vth cells, in other words, a case where the low Vth cells of a logic circuit constituted wholly by the low Vth cells are substituted with the high Vth cells, procedures of an operation (logic circuit design method) of the logic circuit design equipment according to the first embodiment of the present invention will be described below.

(a) First, in step S101, the user inputs information to the CPU 14, more specifically, to the state analysis section 14a. The information specifies such matters as the state of the logic circuit whose leakage current reduction is desired. In term of the state of this logic circuit, there are states including, for example, "a standby state", "an active state" and the like. More specifically, there are states including, for example, "just after an asynchronous reset signal (RST) becomes 1", "just after a certain module signal (CE signal) becomes 0", and the like. In addition, a state at several cycles after the start of the operation is also acceptable. Here, by specifying "standby state" as the state of the logic circuit, the logic circuit in which the leakage current at the standby state is minimal can be constituted, and it is possible to achieve the extended life of, for example, a battery for a portable telephone, a portable terminal and the like. Thereafter, the input unit 11 outputs the state data of the specified state to the state analysis section 14a.

(b) Next, in step S102, the state analysis section 14a reads out logic simulation results from the net list storage unit 15. Furthermore, the state analysis section 14a reads out state data from the input unit 11. Then, the state analysis section 14a analyzes the input states of all of the first cells in the logic circuit respectively, referring to the logic simulation results. For example, in a certain state of the logic circuit specified via the input unit 11, the state analysis section 14a analyzes the input states of the two-input NAND gates 17 and 18 shown in FIG. 2A as "0, 0" and "1, 1", respectively. The state analysis section 14a analyzes all of the low Vth cells constituting the logic circuit as well as the above. Thereafter, the state analysis section 14a outputs the analyzed input state data to the leakage current analysis section 14b.

(c) Next, in step S103, the leakage current analysis section 14b reads out the input state data from the state analysis section 14a. Then, the leakage current analysis section 14b calculates the leakage currents of all of the first cells where each of the first cell is a high Vth cell and where each of the first cells is a low Vth cell, respectively. For example, when the leakage currents of the two two-input NAND gates 17 and 18 shown in FIG. 2A respectively showing the input states of "0, 0" and "1, 1" are analyzed, the leakage current where the two-input NAND gate 17 showing the input state of "0, 0" is a low Vth cell is assumed to be 1 as a reference value, as shown in FIG. 4. A relative value of the leakage current to the reference value, when the two-input NAND gate 17 is a high Vth cell, is 0.1. Furthermore, a relative value of the leakage current of the two-input NAND gate 18 showing the input state of "1, 1" is 10 when the two-input NAND gate 18 is a low Vth cell, and 1 when the two-input NAND gate 18 is a high Vth cell. Accordingly, a reduction amount of the leakage current of this two-input NAND gate 17 is calculated as being 1−0.1=0.9 when a low Vth cell is substituted for a the high Vth cell. For the two-input NAND gate 18 showing the input state of "1, 1", the reduction amount thereof is calculated as 10−1=9. The leakage current analysis section 14b analyzes all of the low Vth cells constituting the logic circuit as well as the above. Thereafter, the leakage current analysis section 14b outputs the calculated leakage current data to the cell substitution section 14c. Although a case where the leakage current analysis section 14b calculates the relative value of the leakage current was described above, the leakage current analysis section 14b may also calculate a concrete leakage current value.

(d) Next, in step S104, the cell substitution section 14c reads out the leakage current data from the leakage current analysis section 14b. Moreover, the cell substitution section 14c reads out a timing restriction from the timing restriction storage unit 16. Then, referring to the logic simulation results of the net list storage unit 15, the cell substitution section 14c substitutes high Vth cells for low Vth cells within a range satisfying the timing restriction. At this time, the cell substitution section 14c selects the cells to be substituted while considering that the leakage current of the cells constituting the logic circuit significantly depends on the input state. Specifically, there is a case where the leakage current of a cell differs depending on the input state in spite of being the same cell. Accordingly, the cell substitution section 14c compares reduction amounts of the leakage currents when low Vth cells of each cell are substituted by high Vth cells in the input state of the logic circuit specified. Then, the low Vth cell showing the greatest of leakage current is selected, and then substituted with the high Vth cell. For example, as shown in FIG. 4, the reduction amount of the leakage current in the two-input NAND gate 18 showing the input state of "1, 1" shown in FIG. 2A is larger than that in the two-input NAND gate 17 showing the input state of "0, 0" shown in FIG. 2A. Accordingly, the two-input NAND gate 18 (the low Vth cell) is preferentially substituted by high Vth cells to the two-input NAND gate 18 rather than the two-input NAND gate 17 within range satisfying the timing restriction. The selection and the substitution of the cell are iterated until just before timing restriction violation is caused. Thereafter, the cell substitution section 14c outputs to the output unit 12 the circuit data of the logic circuit after being subjected to the substitution. Note that, in step S104, the cell substitution section 14c may perform a static timing analysis for the logic simulation result of the net list storage unit 15, and may find a path having latitude with respect to timing. Alternatively, it is also possible to read out the result of a static timing analysis by use of an external unit via the state analysis section 14a.

(e) Next, in step S105, the output unit 12 outputs the circuit data generated by the cell substitution section 14c as the net list of the Dual-Vth logic circuit including both the low Vth cells and the high Vth cells.

According to the logic circuit design method of the first embodiment of the present invention, the low Vth cells of the logic circuit in which all of the cells are constituted by low Vth cells are substituted with the high Vth cells according to the input state of the cells, whereby a Dual-Vth logic circuit to reduce leakage current to a minimum can be easily designed.

(Operation (2) of Logic Circuit Design Equipment)

Figure 5:
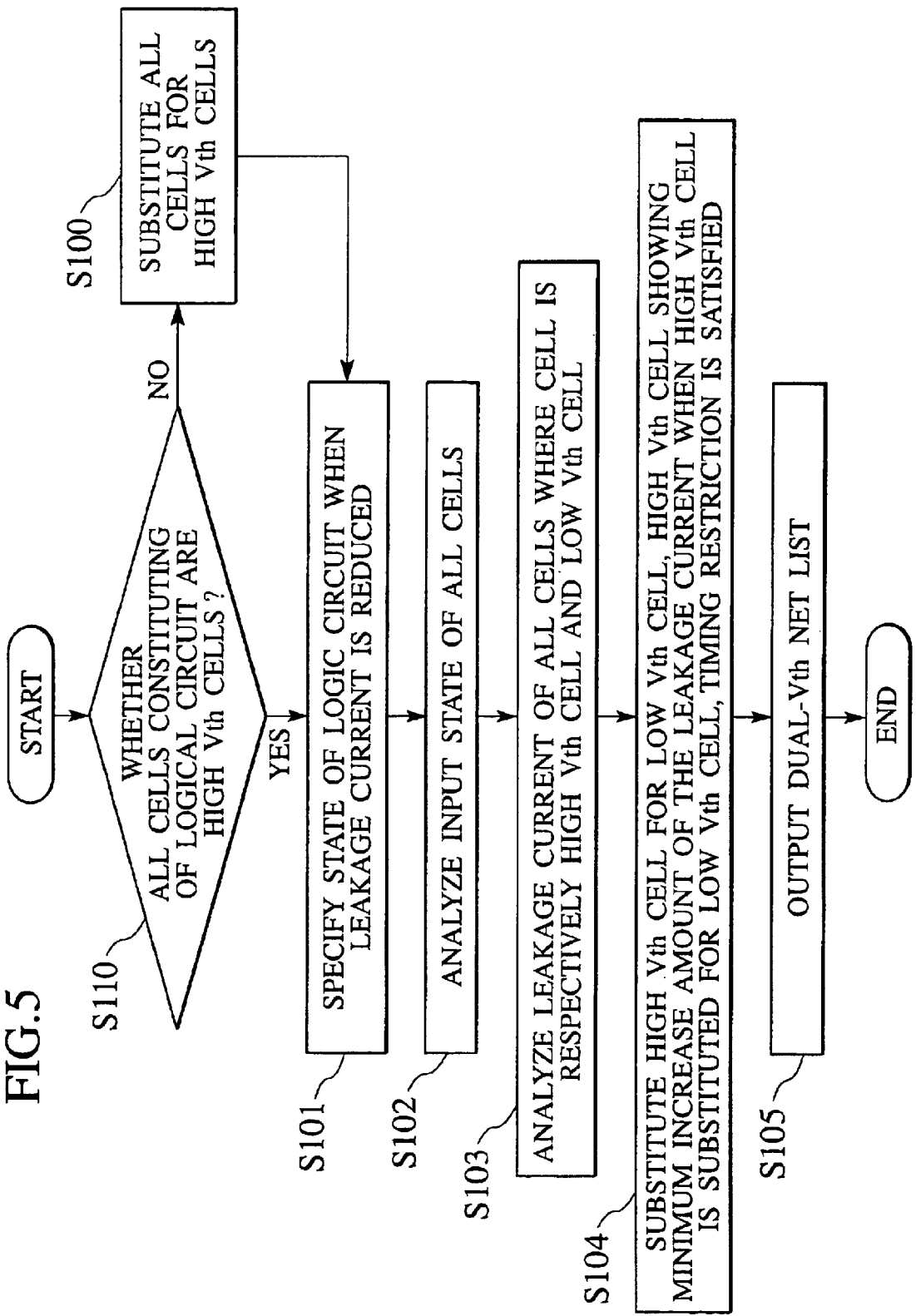
FIG. 5 is a flowchart showing an operation of the logic circuit design equipment according to the first embodiment of the present invention (2).

Next, with reference to FIG. 5, a case where the first cells are high Vth cells and the second cells are low Vth cells, in other words, a case where the high Vth cells of the logic circuit in which all cells constituted by high Vth cells are substituted by low Vth cells, the procedures of an operation of the logic circuit design method according to the first embodiment of the present invention will be described below.

(a) In step S110, when the net list of the net list storage unit 15 has been designed by both the low Vth cells and the high Vth cells, the cell substitution section 14c may substitute high Vth cells with low Vth cells constituting the logic circuit to generate a logic circuit constituted wholly by these high Vth cells to be analyzed and processed in step S100. By the substitution of the cells, it is possible to immediately find the path causing the timing restriction violation. Accordingly, processing time can be further shortened than in the case of the substitution of the cells for the logic circuit in which low Vth cells and high Vth cells coexist. The substitution of the cells is effective particularly when the number of the paths causing the timing restriction violation is small. In step S110, if all of the first cells are high Vth cells, the procedure advances to step S101.

(b) Since the procedures of steps S101 to S103 and step S105 are substantially the same as those in a case where the low Vth cells of the logic circuit constituted wholly by low Vth cells are substituted by high Vth cells described above, duplicate description is omitted.

(c) In step S104, the cell substitution section 14c reads out leakage current data from the leakage current analysis section 14b. Moreover, the cell substitution section 14c reads out the timing restriction from the timing restriction storage unit 16. Then, the cell substitution section 14c finds the path causing the timing restriction violation in the logic circuit constituted wholly by high Vth cells using static timing analysis and the like. Subsequently, the cell substitution section 14c substitutes the low Vth cells for high Vth cells so as to satisfy the timing restriction. These high Vth cells are on a path causing the timing restriction violation and, an increase in leakage current of the logic circuit is minimized when high Vth cells are substituted by low Vth cells. Specifically, the cell substitution section 14c compares the increase in leakage current of each cell around the time of the substitution with that of the others. Furthermore, the cell substitution section 14c substitutes the high Vth cell in which the increase in leakage current is minimized when the substitution of the low Vth cell for the high Vth cell is performed. At this time, the substitution of the low Vth cells for the high Vth cells is performed preferentially to other high Vth cells. Thus, the timing restriction is satisfied. The cell substitution section iterates the comparison and the substitution until the timing restriction is satisfied.

According to the logic circuit design method of the first embodiment of the present invention, it is possible to easily design a Dual-Vth logic circuit with a logic circuit in which all of the cells are constituted by high Vth cells in order to minimize leakage current in the logic circuit.

SECOND EMBODIMENT (Constitution of Logic Circuit Design Equipment)

Figure 6:
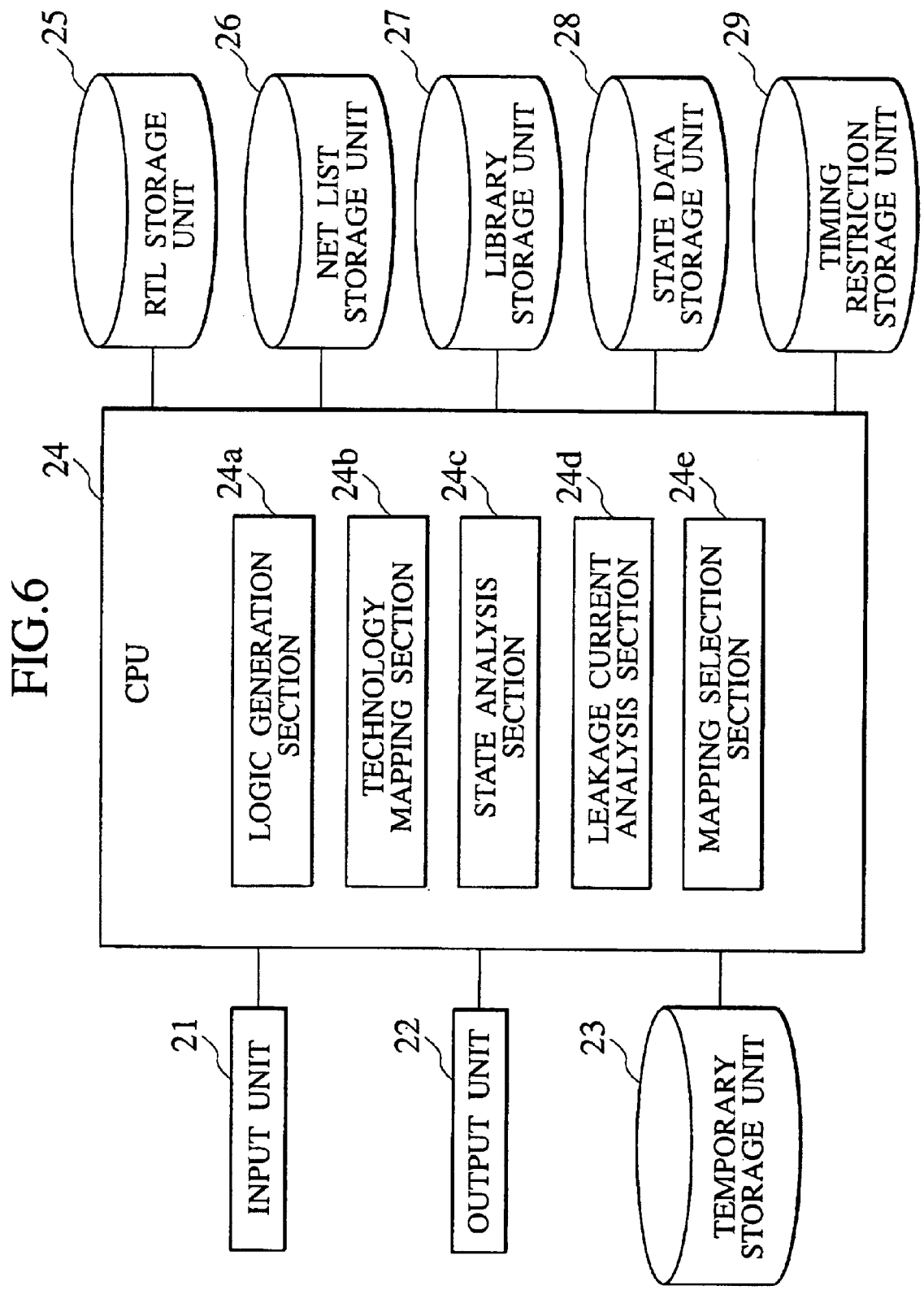
FIG. 6 is a block diagram showing a constitution of a logic circuit design equipment according to a second embodiment of the present invention.

The logic circuit design equipment according to the second embodiment of the present invention has a processing control unit (CPU) 24, an input unit 21, an output unit 22, a temporary storage unit 23, a RTL (Resister Transfer Level) storage unit 25, a net list storage unit 26, a library storage unit 27, a state data storage unit 28 and a timing restriction storage unit 29 connected to the CPU 24, as shown in FIG. 6.

The CPU 24 controls the whole of the logic circuit design equipment according to the second embodiment of the present invention, and is constituted by a logic generation section 24a, a technology mapping section 24b, a state analysis section 24c, a leakage current analysis section 24d and a mapping selection section 24e.

The logic generation section 24a has a function of analyzing words and syntaxes to generate syntax data. Moreover, the logic generation section 24a has a wither function of analyzing syntax data and analyzing logic data.

The technology mapping section 24b has a function of generating new logic circuits by mapping a plurality of certain logic gates constituting the logic circuit to one equivalent logic gate within a range satisfying a timing restriction. When there is a plurality of possible ways of mapping, the logic generation section 24a generates all possible new logic circuits using each of the mapping methods.

The state analysis section 24c has a function of analyzing the input states of each of the new logic circuits respectively, more specifically, the input state of the logic gates constituting the logic circuits. The input states depend on the states of the logic circuits. The states of the logic circuits may be specified via the input unit 21 by the user, in similar it to the first embodiment of the present invention. Alternatively, the states of the logic circuits may be stored in the state data storage unit 28.

The leakage current analysis section 24d has a function of respectively calculating the leakage current of each of the new logic circuits generated by each of mapping methods in reference to the input state data using the analysis of the state analysis section 24c.

The mapping selection section 24e has a function of selecting a new logic circuit having a minimum leakage current from among all of the new logic circuits.

The RTL storage unit 25 stores "RTL" that is information expressed by a language which expresses logics in term of functions. The library storage unit 27 has a library including information concerning the area of each cell, delay time and leakage current. The state data storage unit 28 has internal state data indicating the internal state such as the input states of the cells constituting the logic circuit, which are given as restrictions. Since the structures of the input unit 21, the temporary storage unit (main storage unit) 23, the output unit 23, the net list unit storage unit 26 and the timing restriction storage unit 29 are substantially identical to those of the input unit 11, the temporary storage unit (main storage unit) 13, the output unit 13, the net list storage unit 15 and the timing restriction unit 16 described in the first embodiment of the present invention, duplicate description is omitted.

According to the logic circuit design equipment of the second embodiment of the present invention, mapping which minimizes the leakage current of the logic circuit is made possible. Accordingly, the increase in leakage current that has accompanied microfabrication processing can be suppressed, and hence a logic circuit capable of saving power can be synthesized.

(Operation (1) of Logic Circuit Design Equipment)

Figure 7:
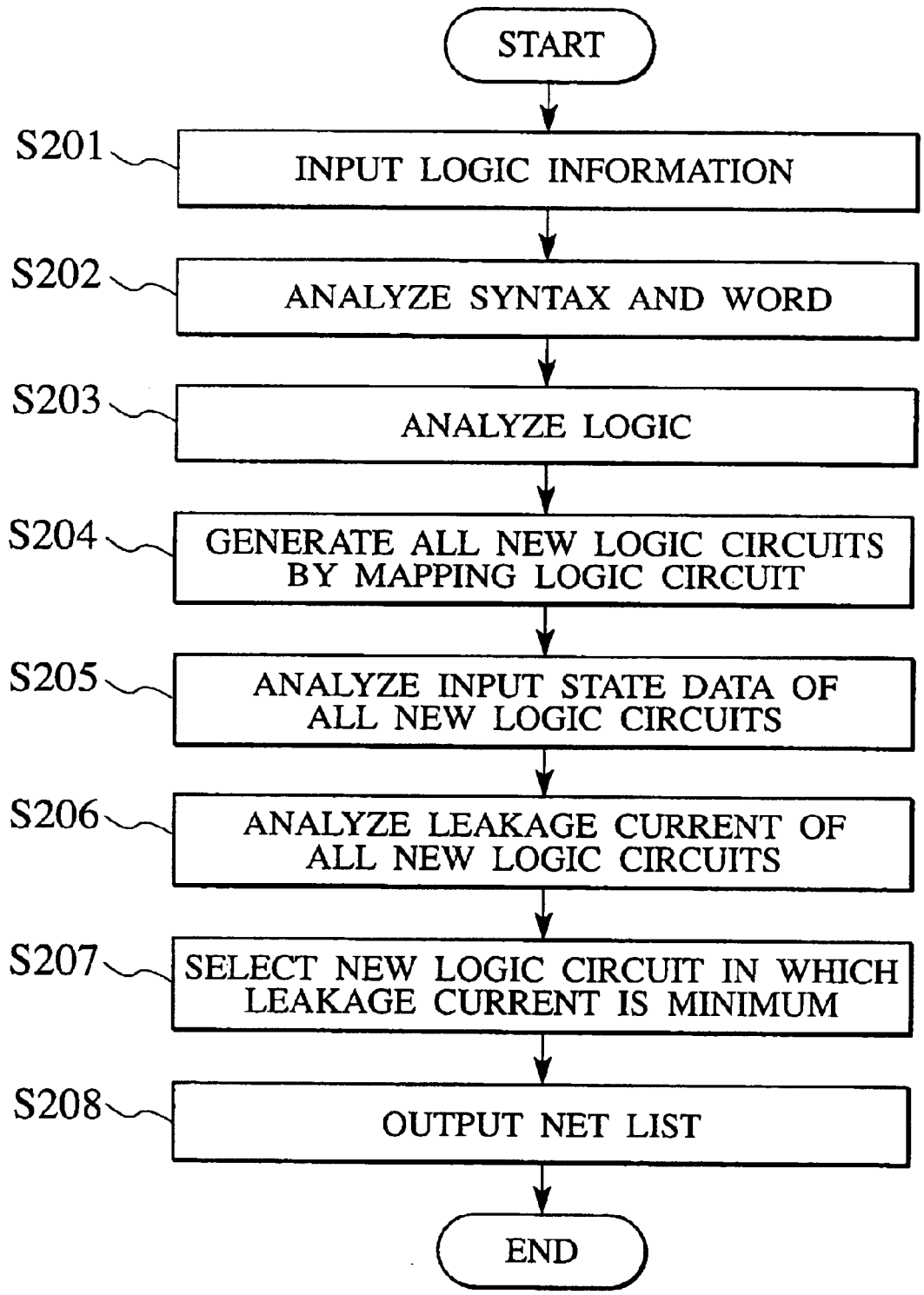
FIG. 7 is a flowchart showing an operation of the logic circuit design equipment according to the second embodiment of the present invention.

Referring to FIG. 7, procedures of an operation of the logic circuit design equipment (logic circuit design method) according to the second embodiment of the present invention will be described below.

(a) First, in step S201, the user inputs information such as data specifying the state of the logic circuit to the logic generation section 24a via the input unit 21 when seeking to be leakage current in the logic circuit.

(b) Next, in step S202, the logic generation section 24a reads out information about the logic and cell from the RTL storage unit 25 or from the net list storage unit 26. At this time, once the area of the cell, the delay time and the leakage current are optimized in the stage where logic synthesis is performed, the logic generation section 24a reads out the RTL from the RTL storage unit 25. Alternatively, if the area of the cell and the delay time have been previously optimized and the leakage current is newly minimized, the logic generation section 24a reads out the net list from the net list storage unit 26. Moreover, the logic generation section 24a reads out the library from the library storage unit 27. Then, the logic generation section 24a analyzes words and syntaxes based on the information concerning these logics and cells, and generates syntax data. Moreover, the logic generation section 24a analyzes syntax data, and generates logic data such as BDD (Binary Decision Diagram). Thereafter, the logic generation section 24a outputs the generated logic data to the technology mapping section 24b.

Figure 8A:
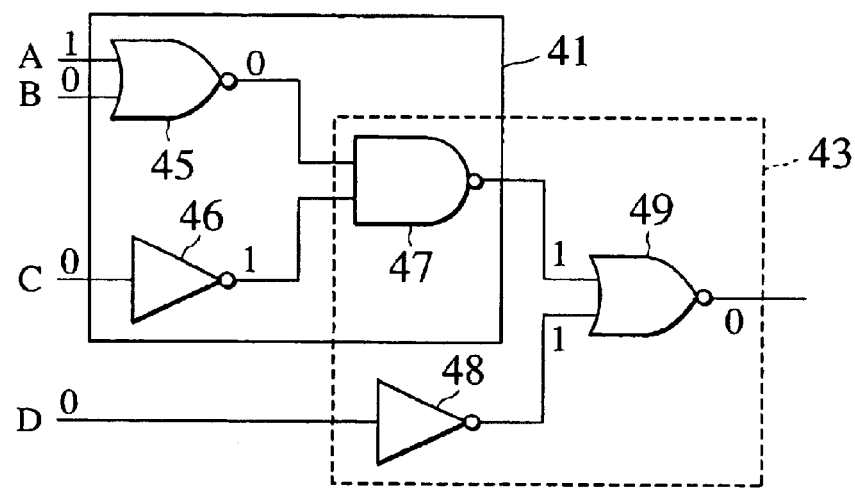
FIG. 8A is a circuit diagram showing part of a logic circuit that is the object of a technology mapping of the logic circuit design equipment according to the second embodiment of the present invention.

(c) Next, in step S204, the technology mapping section 24b reads out the logic data from the logic generation section 24a. Moreover, technology mapping section 24b reads out the timing restriction from the timing restriction storage unit 29. The technology mapping section 24b reads out the library from the library storage unit 27. Then, the technology mapping section 24b maps a plurality of logic gates constituting the logic circuit to one equivalent logic gate within a range satisfying the timing restriction. Consequently, the technology mapping section 24b generates a new logic circuit (hereinafter referred to as a new logic circuit). When there are a plurality of possible mapping ways, the technology mapping section 24b generates all of the new logic circuits by the respective mappings. For example, when the three-stage logic circuit shown in FIG. 8A is mapped, the technology mapping section 24b maps the logic gate group 41 in the logic circuit shown in FIG. 8A to the three-input OR gate (OR3) 42, and can generate a new logic circuit shown in FIG. 8B. Alternatively, the technology mapping section 24b maps the logic gate group 43 to the three-input AND gate (AND3) 44, and can generate the new logic circuit shown in FIG. 8C. Specifically, it is possible to adopt the two ways for the mapping. Since the technology mapping section 24b generates all of the new logic circuits that can be generated by the mapping, the technology mapping section 24b generates the circuit data of the two ways that compare the new logic circuits shown in FIG. 8B and 8C. Note that all of the paths in the new logic circuits shown in FIG. 8B and FIG. 8C satisfy the timing restriction. Thereafter, the technology mapping section 24b outputs the circuit data of all of the new logic circuits generated to the state analysis section 24c.

Figure 8B:
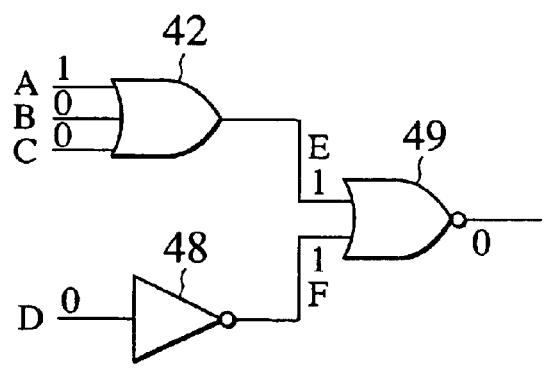
FIG. 8B is a circuit diagram showing an example of a new logic circuit obtained by reconstituting the logic circuit in such a manner that the plurality of logic gates shown in FIG. 8A are collected at one logic gate (1).
Figure 8C:
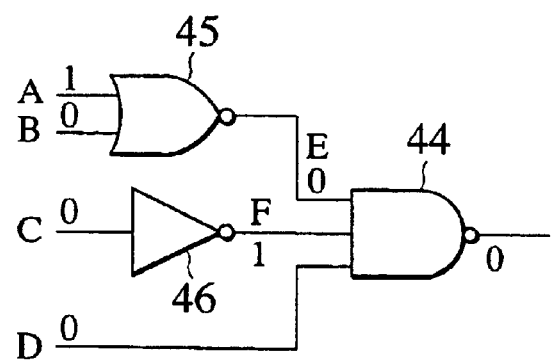
FIG. 8C is a circuit diagram showing an example of a new logic circuit obtained by reconstituting the logic circuit in such a manner that the plurality of logic gates shown in FIG. 8A are collected at one logic gate (2).

(d) Next, in step S205, the state analysis section 24c reads out the circuit data from the technology mapping section 24b. Moreover, the state analysis section 24c reads out the logic simulation result from either the RTL storage unit 25 or the net list storage unit 26. Moreover, the state analysis section 24c reads out the internal state data from the internal state data storage unit 28. Then, the state analysis section 24c analyzes the input states of all of the new logic circuits, respectively. For example, the input states of the logic circuits shown in FIGS. 8A to 8C are analyzed as (A, B, C, D)=(1, 0, 0, 0). Thereafter, the state analysis section 24c outputs the analyzed state data to the leakage current analysis section 24d.

(e) Next, in step S206, the leakage current analysis section 24d reads out the state data from the state analysis section 24c. Furthermore, the leakage current analysis section 24d reads out the library from the library storage section 27. Then, the leakage current analysis section 24d calculates the leakage currents of all of the new logic circuits, respectively. For example, the leakage current analysis section 24d analyzes the leakage currents of the respective logic circuits with respect to the logic circuits shown in FIGS. 8A to 8C. At this time, the value of the leakage current corresponding to each of the input states of the logic circuit is given as shown in FIG. 9. In FIG. 9, the input state of each logic circuit is represented by "a", "b" and "c". In the case of a one-input logic gate, "a" represents the input state, correspondingly. Furthermore, in the case of a two-input logic circuit, "a" and "b" represent the input state, correspondingly. Still furthermore, in the case of a three-input logic gate, each of "a", "b" and "c" represent the input state, correspondingly. With respect to the value of the leakage current of each gate of the logic circuit shown in FIG. 8A, the two-input NOR gate (NOR2) 45 shows 142 pA; the inverter (INV) 46, 46 pA; the two-input NAND gate (NAND2) 47, 41 pA; the inverter (INV) 48, 46 pA; and the two-input NOR gate (NOR2) 49, 46 pA, as shown in FIG. 10A. Accordingly, the leakage current of the logic circuit shown in FIG. 8A is equal to the sum (TOTAL) of the leakage current of each logic gate, and is analyzed as 142+46+41+46+46=321 [pA]. With respect to the value of the leakage current of each gate of the logic circuit shown in FIG. 8B, the three-input OR gate (OR3) 42 shows 171 pA; the inverter (INV) 48, 46 pA; and the two-input NOR gate (NOR2) 49, 46 pA, as shown in FIG. 10B. Accordingly, the leakage current (TOTAL) of the logic circuit shown in FIG. 8B is analyzed as 171+46+46+=263 [pA]. Furthermore, with respect to the value of the leakage current of each gate of the logic circuit shown in FIG. 8C, the two-input NOR gate (NOR2) 45 shows 142 pA; the inverter (INV) 46, 46 pA; and the three-input AND gate (AND3) 44, 152 pA, as shown in FIG. 10C. Accordingly, the leakage current (TOTAL) of the logic circuit shown in FIG. 8C is analyzed as 142+46+152= 340 [pA]. Thereafter, the leakage current analysis section 24d outputs the leakage current data analyzed to the mapping selection section 24e.

(f) Next, in step S207, the mapping selection section 24e reads out the leakage current data from the leakage current analysis section 24d. Then, the mapping selection section 24e compares each of the new logic circuit with others. Furthermore, the mapping selection section 24e selects a new logic circuit in which the leakage current is minimized. For example, the mapping selection section 24e compares each of the leakage currents of the equivalent logic circuits shown in FIGS. 8A to 8C with the others. In this case, since the logic circuit shown in FIG. 8C shows the minimum leakage current, the mapping selection section 24e selects the new logic circuit shown in FIG. 8C. Thereafter, the mapping selection section 24e outputs the circuit data of the selected new logic circuit to the output unit 22.

(g) Next, in step S 208, the output unit 22 outputs the circuit data selected by the mapping selection section 24e as the net list of the logic circuit.

According the logic circuit design method of the second embodiment of the present invention, by considering the input state of the cell, mapping to minimize leakage current of the logic circuit can be performed.

In the logic circuit design method according to the second embodiment of the present invention, although mapping in which the input state is fixed to one state {(A, B, C, D)}=(1, 0, 0, 0)} is given as an example, a case where the input state takes a plurality of states is allowable. Where the input state takes a plurality of states, a logic circuit in which leakage current is minimized can be obtained by selecting the circuit constitution with statistical probability of leakage current being reduced.

Furthermore, a logic circuit (as the logic circuit shown in FIG. 8A) which has not yet been subjected to mapping is treated as the object to be analyzed by the leakage current analysis section 24d in step S206, and further treated as the object to be selected by the mapping selection section 24e in step S207. However, since the new logic circuit generated by mapping has greatly reduced leakage current, it is possible to treat only the new pare of logic circuit as the circuits shown in FIG. 8B, 8C as the object to be analyzed and selected.

THIRD EMBODIMENT (Constitution of Logic Circuit Design Equipment)

Figure 11:
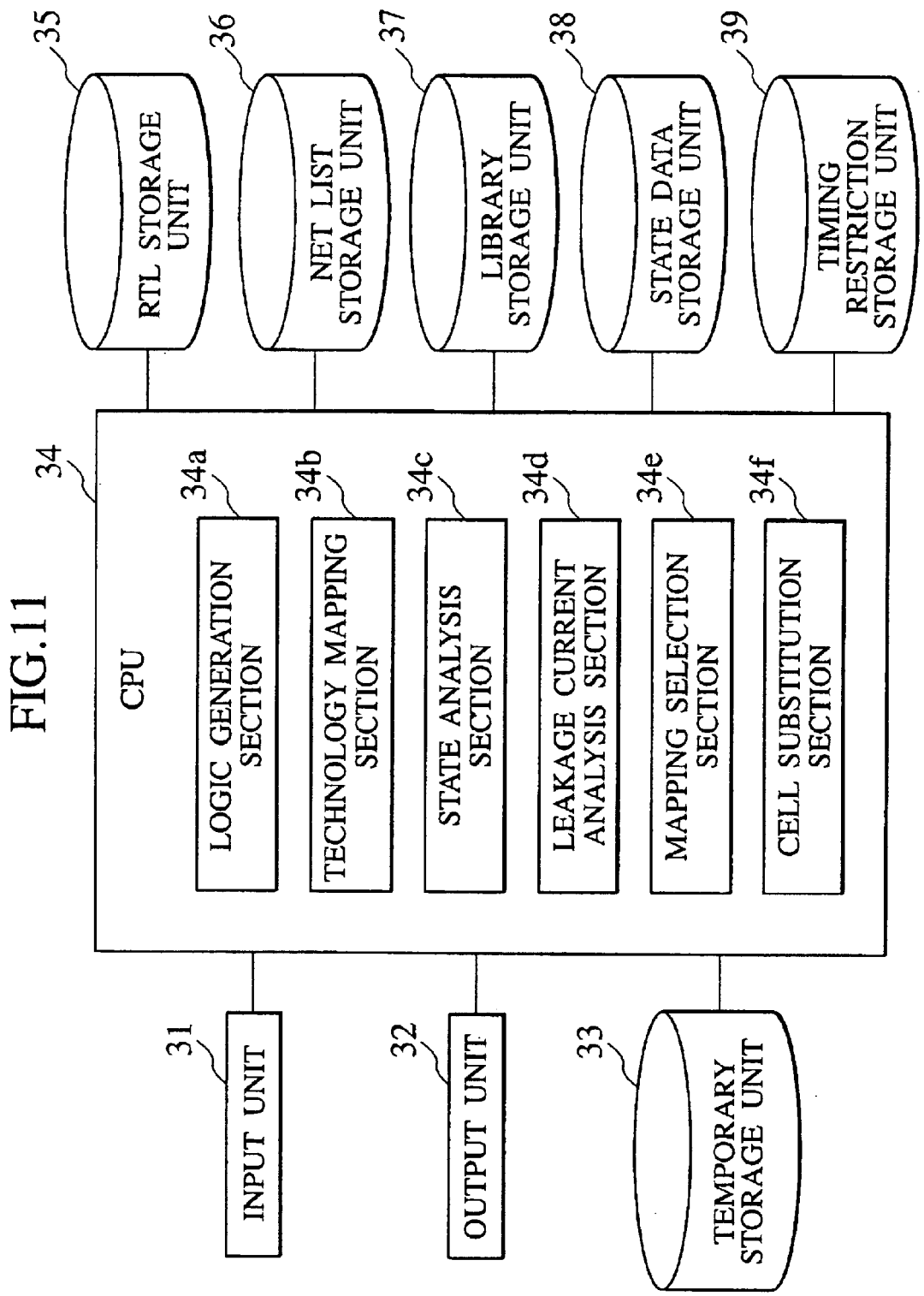
FIG. 11 is a block diagram showing a constitution of a logic circuit design equipment according to a third embodiment of the present invention.

The logic circuit design equipment according to a third embodiment of the present invention of the present invention has a processing control unit (CPU) 34, an input unit 31, an output unit 32, a temporary storage unit (main storage unit) 33, a RTL storage unit 35, a net list storage unit 36, a library storage unit 37, a state data storage unit 38, and a timing restriction storage unit 39 connected to the CPU 34, as shown in FIG. 11.

The CPU 34 has a logic generation section 34a, a technology mapping section 34b, a state analysis section 34c, a leakage current analysis section 34d, a mapping selection section 34e and a cell substitution section 34f.

Since the structures of the state analysis section 34c and the leakage current analysis section 34d are substantially the same as those of the state analysis section 24c and the leakage current analysis section 24d shown in the second embodiment of the present invention, duplicate description of them is omitted. Although the structure of the technology mapping section 34b is substantially the same as that of the technology mapping section 24b shown in the second embodiment of the present invention, the technology mapping section 34b of this embodiment differs from the technology mapping section 24b of the second embodiment in that the technology mapping section 34b of this embodiment performs mapping from the library of the library storage unit 37 by use of the first cell and generates new logic circuits constituted wholly by the first cell. Moreover, the mapping selection section 34e is substantially the same as the mapping selection section 24e shown in the second embodiment of the present invention. However, the mapping selection section 34e of this embodiment differs from the mapping selection section 24e of the second embodiment in that the mapping selection section 34e output the circuit data of a new logic circuit selected to the cell substitution section 34f. Moreover, the structure of the cell substitution section 34f is substantially the same as that of the cell substitution section 14c shown in the first embodiment of the present invention. However, the cell substitution section 34f of this embodiment differs from the cell substitution section 14c of the first embodiment in that the cell substitution section 34f substitutes the second cell for the first cell use of the circuit data from the mapping selection section 34e.

The structures of the temporary storage unit (main storage unit) 33, the input unit 31, the output unit 33, the RTL storage unit 35, the net list storage unit 36, the library storage unit 37, the state data storage unit 35, and the timing restriction storage unit 39 are substantially the same as those of the temporary storage unit (main storage unit) 23, the input unit 21, the output unit 22, the RTL storage unit 25, the net list storage unit 26, the library storage unit 27, the state data storage unit 28 and the timing restriction storage unit 29 shown in the second embodiment of the present invention. Therefore, duplicate description of them is omitted.

The logic circuit design equipment according to the third embodiment of the present invention has a function of substituting the second cell and a function of performing the mapping shown in the second embodiment of the present invention for the first cell shown in the first embodiment of the present invention.

According to the logic circuit design equipment of the third embodiment of the present invention, the leakage current of a Dual-Vth logic circuit can be minimized by performing the analysis and the process with consideration of the input state of the cell, and mapping which minimizes leakage current can be performed. Accordingly, the increase in leakage current that has accompanied the microfabrication of processing can be suppressed, and a power-saving Dual-Vth logic circuit can be synthesized.

(Operation (1) of Logic Circuit Design Equipment)

Next, referring to FIG. 12, in a case where the low Vth cells of a logic circuit constituted wholly by low Vth cells are substituted by high Vth cells, operation procedures (logic circuit design method) of the logic circuit design equipment according to the third embodiment of the present invention will be described below.

(a) Since the procedures of steps S301 to S303 are substantially the same as those of steps S201 to S203 shown in the second embodiment of the present invention, duplicate description is omitted.

(b) In step S304, the technology mapping section 34b generates a new logic circuit by performing the mapping of a plurality of logic gates constituting the logic circuit to one equivalent logic gate for the logic circuit by use of low Vth cells in the library of the library storage unit 37 within a range satisfying a timing restriction. When there are a plurality of possible ways of mapping, the technology mapping section 34b generates all possible new logic circuits constituted by the performance of each of the mapping ways.

(c) The procedures of steps S305 and S306 are substantially the same as those of step S205 and S206 shown in the second embodiment of the present invention. Accordingly, duplicate description is omitted.

(d) In step S307, the mapping selection section 34e compares each of the new logic circuits generated by the technology mapping section 34b with the others, and selects a new logic circuit in which leakage current is minimized. The mapping selection section 34e outputs this selected new logic circuit as the circuit data to the cell substitution section 34f.

(e) In step S308, the cell substitution section 34f reads out the circuit data from the mapping selection section 34e. Moreover, the cell substitution section 34f reads out the timing restriction from the timing restriction storage unit 39. Then, the cell substitution section 34f compares each of the low Vth cells with each others constituting the selected new logic circuit, and substitutes high Vth cells for low Vth cells. In low Vth cells, leakage current is minimized by the substitution of the low Vth cells with high Vth cells within a range satisfying a timing restriction. The cell substitution section 34f repeatedly performs the substitution of the cells within a range satisfying a timing restriction to reduce leakage current in the logic circuit. Thereafter, the cell substitution section 34f outputs the circuit data of the logic circuit substituted to the output unit 33.

(f) Next, in step S309, the output unit 33 outputs the circuit data generated by the cell substitution section 34f as the net list to the Dual-Vth logic circuit.

According to the logic circuit design method of the third embodiment of the present invention, the Dual-Vth logic circuit design in which the leakage current is minimized and the logic circuit mapping can be easily realized for the logic circuit constituted wholly by low Vth cells.

(Operation 2 of Logic Circuit Design Equipment)

Next, referring to FIG. 13, in a case where the high Vth cells of the logic circuit constituted wholly by high Vth cells is substituted by low Vth cells, in other words, in a case where the first cells are high Vth cells and the second cells are low Vth cells, procedures of the logic circuit design method according to the third embodiment of the present invention will be described below.

(a) In step S310, when the net list of the net list storage unit 15 is designed by both low Vth cells and high Vth cells, all of the low Vth cells constituting the logic circuit are substituted by high Vth cells, and the logic circuit constituted wholly by high Vth cells to be analyzed and processed is generated by the cell substitution section 34f in step S300. In step S310, when all of the cells of the net list in the net list storage unit 15 is the logic circuit constituted by high Vth cells, the procedure advances to step S301.

(b) The procedures of steps S301 to S307 are substantially the same as those in a case where the low Vth cells of the logic circuit constituted wholly by low Vth cells are substituted by high Vth cells. Therefore, duplicate description of them is omitted.

(c) In step S308, when a path causing the timing cell restriction violation exists in the logic circuit, the cell substitution section 34f substitutes low Vth cells for high Vth cells on this path so as to satisfy the timing restriction while considering the input states. Specifically, when the high Vth cells are substituted by low Vth cells, leakage current increases. The cell substitution section 34f compares the leakage current of the cells, and preferentially substitutes the low Vth cell for a high Vth cell showing the smallest increase in leakage current. This substitution of cells is iterated until all of the paths come to satisfy the timing restriction.

(d) Next, the procedure of step S309 is substantially the same as that in a case where the low Vth cells of the logic circuit constituted wholly by low Vth cells are substituted by high Vth cells. Therefore, duplicate description is omitted.

According to the logic circuit design method of the third embodiment of the present invention, the Dual-Vth logic circuit design and the logic circuit mapping, in which leakage current is minimized, can be easily realized also with respect to the logic circuit in which all of the cells are constituted by the high Vth cells.

OTHER EMBODIMENTS

The present invention is not limited to the foregoing embodiments, and the present invention can be embodied by other various embodiments in terms of concrete constitutions, functions, operations and effects without departing from the scope of the present invention.

For example, though the cell is exchanged so as to minimize leakage current in step S104 of the first embodiment of the present invention and step S308 of the third embodiment of the present invention, the first cell may be exchanged so as to relatively reduce the leakage current in consideration of other factors such as the magnitude of path delays as well as the reduction of leakage current. Moreover, though the new logic circuit minimizing leakage current is selected in the procedure in step S207 of the second embodiment of the present invention and the procedure in step S307 of the third embodiment of the present invention, mapping may be performed so as to relatively reduce leakage current in consideration of other factors as well as the selection of this new logic circuit.

In the operation 2 of the logic circuit design equipment according to the first embodiment of the present invention, the procedure of step S100 is not limited to being performed prior to the procedure of step S101. Specifically, as shown in FIG. 14, step S100 may be performed at any time between step S101 and S104 as long as step S100 is performed before the substitution processing (step S104) of high Vth cells with the low Vth cells. The procedure of step S300 in the third embodiment of the present invention may be performed at any time between step S300 and S307.

As described above, it is natural that the present invention includes various embodiments which are not described in this specification. Accordingly, the technical gist of the present invention is defined only by the following valid claims based on the above descriptions.

What is claimed is:

1. A logic circuit design equipment, comprising:
   a technology mapping section configured to generate new logic circuits by mapping a plurality of logic gates constituting a logic circuit to an equivalent logic gate within limits of a timing restriction;
   a state analysis section configured to analyze input states of all of said new logic circuits, respectively;
   a leakage current analysis section configured to calculate leakage currents of all of said new logic circuits in said input state, respectively; and
   a mapping selection section configured to compare all of said now logic circuits with each other in order to select said new logic circuit showing a minimum leakage current.

2. The logic circuit design equipment of claim 1, further comprising a cell substitution section configured to compare first cells constituting said selected new logic circuit, and configured to substitute a second cell for said first cell within a range satisfying a timing restriction, wherein a threshold of said second cell is different from a threshold of said first cell.

3. The logic circuit design equipment of claim 2, wherein said first cells are low Vth cells, and said second cells are high Vth cells.

4. The logic circuit design equipment of claim 3, wherein said cell substitution section substitutes said low Vth cell showing the most reduction amount of said leakage current when said low Vth cells are substituted by said high Vth cells preferentially among all of said low Vth cells in said logic circuit.

5. The logic circuit design equipment of claim 2, wherein said first cells are high Vth cells, and said second cells are low Vth cells.

6. The logic circuit design equipment of claim 5, wherein said cell substitution section substitutes said high Vth cell showing a minimum increase of the leakage current by said low Vth cell preferentially from among said high Vth cells on a path causing a timing restriction violation in said selected new logic circuits.

7. A method for designing a logic circuit, comprising:
   analyzing input states of all of first cells constituting a logic circuit, respectively;

analyzing leakage currents of all of said first cells when each said first cell is a high Vth cell showing a small amount of leakage current at a low speed operation and when each said first cell is a low Vth cell showing a large amount of leakage current at a high speed operation, respectively; and substituting second cells for said first cells so as to satisfy a timing restriction, wherein a threshold of said second cells is different from a threshold of said first cells.

8. The method of claim 7, wherein in said substitution of said second cells for said first cells, said first cells are in a logic circuit constituted wholly by said first cells.

9. The method of claim 7, wherein said first cells tire said low Vth cells, and said second cells are said high Vth cells.

10. The method of claim 9, wherein said substituting second cells for said first cells comprises:

selecting said low Vth cell showing the most reduction in leakage current when said low Vth cell is substituted by said high Vth cell; and, substituting said high Vth cell for said selected low Vth cell.

11. The method of claim 7, wherein said first cells are said high Vth cells, and said second cells are said low Vth cells.

12. The method of claim 11, wherein said substituting second cells for said first cells substitutes said low Vth cells for said high Vth cells on a path causing a timing restriction violation in order to satisfy said timing restriction.

13. The method of claim 11, wherein said substituting second cells for said first cells comprises:

selecting said high Vth cell showing minimum increase in leakage current when said high Vth cell is substituted by said low Vth cell; and, substituting said low Vth cell for said selected high Vth cell.

14. The method of claim 11, further comprising substituting all of said low Vth cells constituting said logic circuit of both said low Vth cells and said high Vth cells before substituting said low Vth cells for said high Vth cells.

15. A method for designing a logic circuit, comprising:

generating all of new logic circuits constituted by mapping a plurality of logic gates constituting a logic circuit to a one logic gate equivalent to said plurality of logic gates within a range satisfying a timing restriction;

analyzing an input state of all of said new logic circuits, respectively;

calculating a leakage current of all of said new logic circuits in said respective input state, respectively; and comparing all of said new logic circuits, and selecting said new logic circuit having a minimal leakage current.

16. The method of claim 15, further comprising substituting second cells for first cells constituting said selected logic circuit within a range satisfying said timing restriction, wherein a threshold of said second cells is different from a threshold of said first cells.

17. The method of claim 16, wherein said first cells are low Vth cells, and second cells are high Vth cells.

18. The method of claim 17, wherein said substitution of said cells for said first cells selects said low Vth cell showing the most reduction of leakage current by said high Vth cell.

19. The method of claim 16, wherein said first cells are high Vth cells, and second cells are low Vth cells.

20. The method of claim 19, wherein said substitution of said cells second cells for said first cells selects said high Vth cell showing a minimum increase amount of the leakage current by said low Vth cell from among said high Vth cells on a path causing a timing restriction violation in said selected new logic circuit.

* * * * *